US 6,670,772 B1

(12) United States Patent
Arnold et al.

(10) Patent No.: US 6,670,772 B1
(45) Date of Patent: Dec. 30, 2003

(54) ORGANIC LIGHT EMITTING DIODE DISPLAY WITH SURFACE PLASMON OUTCOUPLING

(75) Inventors: Andrew D. Arnold, Hilton, NY (US); Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/184,358

(22) Filed: Jun. 27, 2002

(51) Int. Cl.[7] .......................... H05B 33/00; G09G 3/00; H01L 1/62
(52) U.S. Cl. ..................... 315/169.3; 313/504
(58) Field of Search .................. 315/169.3, 200 R, 315/169.1; 345/77, 76, 211, 212, 82; 362/84, 800; 528/12; 313/504, 503, 505

(56) References Cited

U.S. PATENT DOCUMENTS

| 5,552,678 | A | * | 9/1996 | Tang et al. ............... 315/169.3 |
| 5,828,181 | A | * | 10/1998 | Okuda ..................... 315/169.3 |
| 6,337,381 | B1 | * | 1/2002 | Biebuyck et al. ............ 528/12 |
| 6,384,427 | B1 | * | 5/2002 | Yamazaki et al. ............ 257/59 |
| 6,424,326 | B2 | * | 7/2002 | Yamazaki et al. ............ 345/77 |

FOREIGN PATENT DOCUMENTS

WO  WO 02/37568 A1  5/2002

OTHER PUBLICATIONS

Safonov et al., Modification of polymer light emission by lateral microstructure, *Synthetic Metals* 116, 2001, pp. 145–148.

Gifford et al., Extraordinary transmission of organic photoluminescence through an otherwise opaque metal layer via surface plasmon cross coupling, *Applied Physics Letters*, vol. 80, No. 20, May 2, 2002, pp. 3679–3681.

Tsutsui et al., Sharply directed emission in organic electroluminescent diodes with an optical–microcavity structure, *Applied Physics Letters* 65, No. 15, Oct. 10, 1994, pp. 1868–1870.

Lupton et al., Brass scattering from periodically microstructured light emitting diodes, *Applied Physics Letters*, vol. 77, No. 21, Nov. 20, 2000, pp. 3340–3342.

Tsutsui et al., Doubling Coupling–Out Efficiency in Organic Light–Emitting Devices Using a Thin Silica Aerogel Layer, *Advanced Materials*, 13, No. 15, Aug. 3, 2001, pp. 1149–1152.

* cited by examiner

Primary Examiner—Don Wong
Assistant Examiner—Chuc Tran
(74) Attorney, Agent, or Firm—Thomas H. Close

(57) ABSTRACT

An active matrix organic light emitting diode (OLED) display includes a substrate; a thin-film transistor (TFT) layer formed on the substrate; a layer defining a periodic grating structure; a first electrode layer formed over the grating structure and conforming to the grating structure; an OLED material layer formed over the first electrode layer and conforming to the grating structure; and a second electrode layer formed over the OLED material layer and conforming to the grating structure, wherein the first and/or second electrode layers are metallic layers, whereby the periodic grating structure induces surface plasmon cross coupling in the metallic electrode layer(s).

13 Claims, 3 Drawing Sheets

ORGANIC LIGHT EMITTING DIODE DISPLAY WITH SURFACE PLASMON OUTCOUPLING

FIELD OF THE INVENTION

The present invention relates to organic light emitting diode displays, and more particularly to increasing the light output from the emissive layers.

BACKGROUND OF THE INVENTION

Organic light emitting diodes (OLED are a promising technology for flat-panel displays. The technology relies upon thin-film layers of materials coated upon a substrate. However, as is well known, much of the light output from the emissive elements in the OLED is absorbed within the device. Because the light emission from the OLED is Lambertian, light is emitted equally in all directions so that some of the light is emitted forward to a viewer, some is emitted to the back of the device and is either reflected forward to a viewer or absorbed, and some of the light is emitted laterally and trapped and absorbed by the various layers comprising the device. In general, up to 80% of the light may be lost.

A variety of techniques have been proposed to improve the out-coupling of light from thin-film displays. For example, diffraction gratings have been proposed to control the attributes of light emission from thin polymer films by inducing Bragg scattering of light that is guided laterally through the emissive layers, see Modification of polymer light emission by lateral microstructure" by Safonov et al., Synthetic Metals 116, 2001, pp. 145–148, and "Bragg scattering from periodically microstructured light emitting diodes" by Lupton et al., Applied Physics Letters, Vol. 77, No. 21, Nov. 20, 2000, pp. 3340–3342. Brightness enhancement films having diffractive properties and surface and volume diffusers are described in WO0237568 A1 entitled "Brightness and Contrast Enhancement of Direct View Emissive Displays" by Chou et al. Mar. 2, 2001.

The use of micro-cavities and scattering techniques is also known, for example see "Sharply directed emission in organic electroluminescent diodes with an optical-microcavity structure" by Tsutsui et al., Applied Physics Letters 65, No. 15, Oct. 10, 1994, pp. 1868–1870. However, none of these approaches capture all, or nearly all, of the light produced.

It has been proposed to use a periodic, corrugated, grating structure to induce surface plasmon coupling for the light emitting layer in an organic luminescent device, thereby inhibiting lateral transmission and wave guiding of emitted light while increasing the efficiency and the light output of the structure. It is theoretically possible to couple up to 93% of the light emitted by the organic luminescent materials in an organic luminescent device. See "Extraordinary transmission of organic photoluminescence through an otherwise opaque metal layer via surface plasmon cross coupling" by Gifford et al., Applied Physics Letters, Vol. 80, No. 20, May 20, 2002. Gifford et al. disclose creating the grating geometry for photoluminescent surface plasmon coupling by exposing a photoresist on glass with an interferometric pattern, followed by depositing subsequent layers that replicate the underlying surface profile. This approach is not compatible with the current manufacturing techniques used to make active matrix OLED displays, since for top-emitting OLED display devices, a layer of thin-film transistors are formed on the substrate prior to forming the OLEDs. For bottom-emitting OLED displays, manufacturing starts with a glass substrate that is coated with a layer of conductive indium tin oxide (ITO) that is patterned to provide conductors for thin-film transistors located on the substrate. The use of photoresist to create plasmon inducing gratings is problematical because the photoresist is an electrical insulator, thereby isolating the underlying ITO conductors from the OLED materials. Gifford et al. also suggest that the use of surface plasmon coupling can be an efficient means for outcoupling electroluminescence in an OLED device by using shadow masks on any desirable substrate. The use of shadow masks is not practical to create the gratings because of the small dimensions of the gratings. They also disclose that they have fabricated an OLED that uses surface plasmon coupling on a silicon substrate, but silicon substrates are not conventional or practical for OLED display devices.

There is a need therefore for an improved organic light emitting diode display structure that avoids the problems noted above and improves the efficiency of the display for practical devices.

SUMMARY OF THE INVENTION

The need is met according to the present invention by providing a active matrix organic light emitting diode (OLED) display that includes a substrate; a thin-film transistor (TFT) layer formed on the substrate; a layer defining a periodic grating structure; a first electrode layer formed over the grating structure and conforming to the grating structure; an OLED material layer formed over the first electrode layer and conforming to the grating structure; and a second electrode layer formed over the OLED material layer and conforming to the grating structure, wherein the first and/or second electrode layers are metallic layers, whereby the periodic grating structure induces surface plasmon cross coupling in the metallic electrode layer(s).

In one embodiment, the OLED display is a top-emitting active matrix organic light emitting diode (OLED) display that includes a substrate; a thin-film transistor (TFT) layer formed on the substrate; an insulating layer formed over the TFT layer, the insulating layer defining a periodic grating structure, a first electrode layer formed over the insulating layer and conforming to the grating structure; an OLED material layer formed over the first electrode layer and conforming to the grating structure; and a second electrode layer formed over the OLED material layer and conforming to the grating structure, wherein the first and/or second electrode layers are metallic layers, whereby the periodic grating structure induces surface plasmon cross coupling in the metallic electrode layer(s).

In an alternative embodiment, the OLED display is a bottom-emitting active matrix organic light emitting diode (OLED) display that includes a substrate; a first electrode layer formed on the substrate, the first electrode layer having first portions defining a periodic grating structure and second portions free of such a grating structure; a thin-film transistor (TFT) layer formed on the second portions of the first electrode layer; an OLED material layer formed over the first portions of the first electrode layer and conforming to the grating structure; and a second electrode layer formed over the OLED material layer and conforming to the grating structure, wherein the first and/or second electrode layers are metallic layers, whereby the periodic grating structure induces surface plasmon cross coupling in the metallic layer(s).

DETAILED DESCRIPTION OF THE INVENTION

Figure 2:
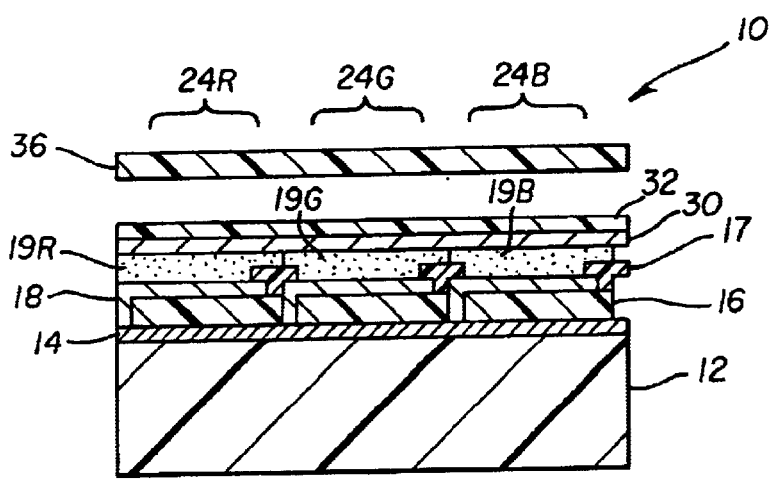
FIG. 2 is a schematic cross sectional diagram of a prior art top-emitting OLED display.

Referring to FIG. 2, a prior art top-emitting OLED display device 10 includes a substrate 12, and a thin-film transistor (TFT) active matrix layer 14 comprising an array of TFTs that provides power to OLED elements. A patterned first insulating layer 16 is provided over the TFT active matrix layer, and an array of first electrodes 18 are provided over a planarized insulating layer 16 and in electrical contact with the TFT active matrix layer. A patterned second insulating layer 17 is provided over the array of first electrodes 18 such that at least a portion of the each of the first electrodes 18 is exposed.

Over the first electrodes and insulating layers are provided red, green, and blue-emitting organic OLED elements, 19R, 19G, and 19B, respectively. These elements are composed of further layers as described in more detail below. Herein, the collection of OLED elements, including hole injection, hole transport, and electron transport layers may also be referred to as the OLED layer 19. The light-emitting area is generally defined by the area of the first electrode 18 in contact with the OLED elements. Over the OLED layer 19 is provided a transparent, common second electrode 30 that has sufficient optical transparency to allow transmission of the generated red, green, and blue light. An optional second electrode protection layer 32 may be provided to protect the electrode and underlying layers. Each first electrode in combination with its associated OLED element and second electrode is herein referred to as an OLED. A typical top-emitting OLED display device comprises an array of OLEDs wherein each OLED emits red, green or blue. A gap, generally filled with inert gas or a transmissive polymer material, separates the electrode protection layer from an encapsulating cover 36. The encapsulating cover 36 may also be a layer deposited directly on the common second electrode 30 or the optional second electrode protection layer 32.

In operation, the thin-film transistors in TFT layer 14 control the current between the first electrodes 18, each of which can be selectively addressed, and the common second electrode 30. Holes and electrons recombine within the OLED elements to emit light 24 R, G and B from the light emitting elements 19 R, G and B respectively. Because the layers are so thin, typically several hundred angstroms, they are largely transparent.

Figure 1:
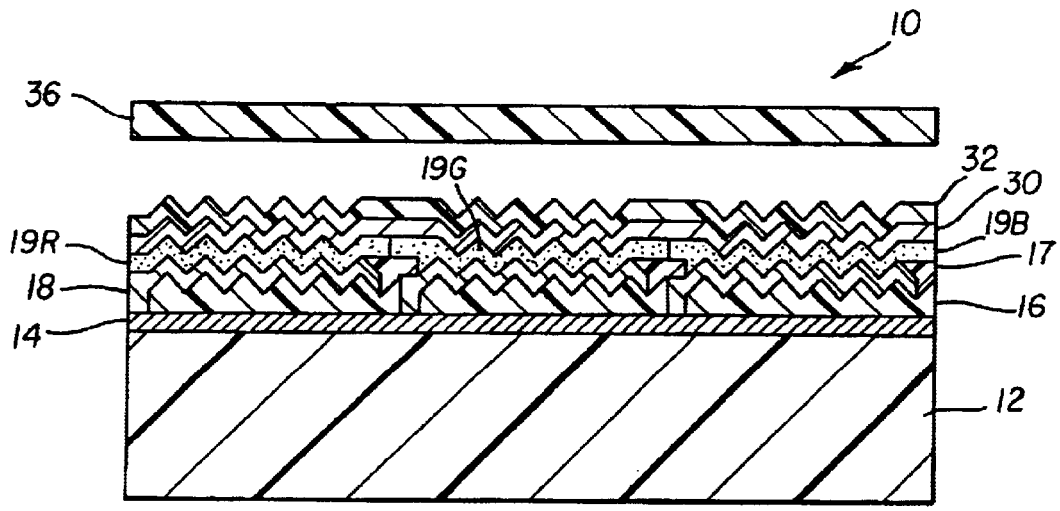
FIG. 1 is a schematic cross sectional diagram of a top-emitting OLED display according to the present invention.

Referring to FIG. 1 a top-emitter embodiment of the present invention includes a substrate 12, TFT layer 14, an insulating layer 16, first patterned electrode 18, and second insulating layer 17. Conventional OLED layers 19 are deposited upon the insulating layer 17 and first patterned metal electrodes 18. A second, common electrode 30 and protection layer 32 are deposited above the OLED layers 19. The display 10 is encapsulated with an encapsulating cover or layer 36.

The insulating layer 16 is made of conventional materials but is not a conventional planarization layer as in the prior art but rather has a periodic physical grating structure that makes the layer thicker in some locations and thinner in others. The size and period of the grating structure is selected to be effective to cause surface plasmon cross coupling in overlying metallic layers that conform to the grating structure. In particular, the first patterned metal electrode 18 has a similar periodic structure, as do the OLED layers 19. The second electrode layer 30 is likewise conformable to the grating structure, but the top surface of the second electrode layer 30 or layers above the second electrode 30 may, or may not, conform to the periodic grating structure.

In a preferred embodiment, the periodic grating structure of the insulating layer 16 differs for each of the red, green, and blue OLED light emitting areas 19R, 19G, and 19B respectively. The period of the grating structure is dependent on the frequency of light emitted by the OLED materials. For example, the periodic structure of the insulating layer 16 can have a period ranging from 200 to 1000 nm. The height of the physical structure is about 100 nm although larger or smaller heights are possible; the minimum thickness of the insulating layer must be sufficient to provide good insulation between the first patterned metal electrode 18 and the thin-film electronics devices 14. The period and heights of the periodic grating structure affect the frequency of optimum cross-coupling and angular dependence. In general, the OLED element layer should be as thin as possible to cause as much energy as possible to undergo surface plasmon cross coupling in the metallic layers. The insulating layer 16 may be reflective or transmissive, or may be opaque to increase the contrast of the device. The insulating layer 16 is made by conventional means, for example photolithography.

In operation, current is passed via the electrodes 18 and 30 through the light emitting elements 19 causing light to be emitted both upward through second electrode 30 and downward toward the substrate. The periodic structure of the first patterned metal electrode 18 and the OLED layer 19 causes surface plasmon cross coupling between the layers. The surface plasmon effect has the additional benefit of reducing the absorption of light in the electrode, further increasing the light output from the device. The emission from the OLED device is no longer Lambertian, but is highly directional along an axis perpendicular to the display. The light emitted forward is seen by a viewer. The light emitted backward is either absorbed or reflected by the insulating layer.

Figure 3:
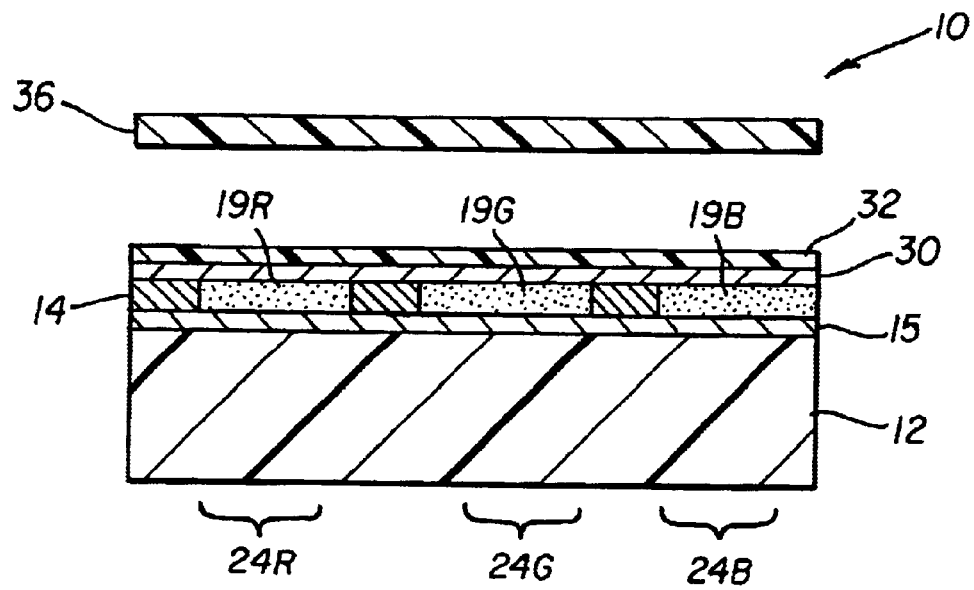
FIG. 3 is a schematic cross sectional diagram of a prior art bottom-emitting OLED display.

The present invention may be applied to both a top-emitter (wherein light is emitted through the cover as described above) or a bottom-emitter (wherein light is emitted through the substrate). In the bottom emitter case, the periodic grating structure may be created directly upon the substrate 12, or to insulating or conducting layers applied to the substrate. Referring to FIG. 3, a prior art bottom-emitter device uses a patterned conductive layer 13 of indium tin oxide (ITO) deposited on the substrate to conduct current to the light emitting areas.

Figure 4:
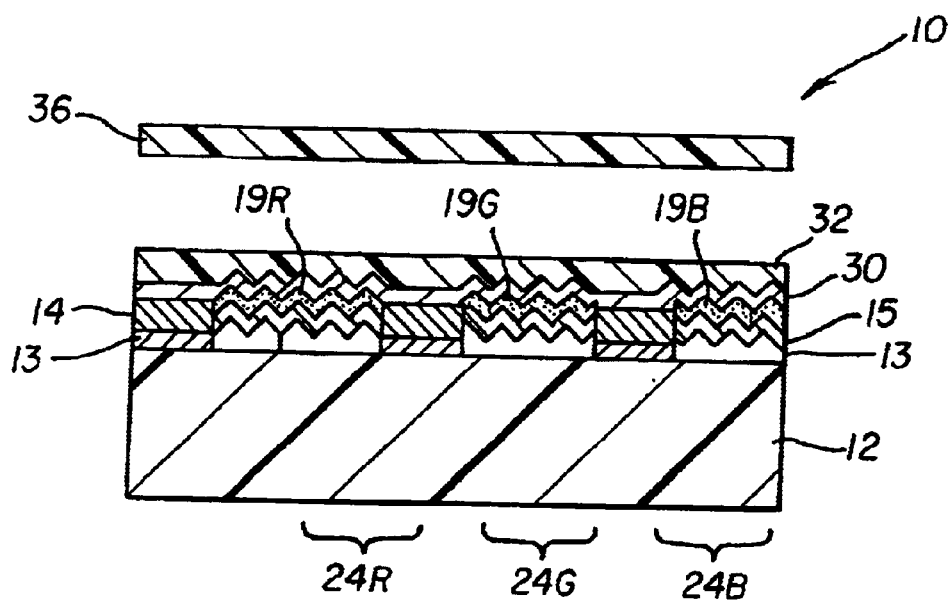
FIG. 4 is a schematic cross sectional diagram of a bottom-emitting OLED display according to the present invention.

Referring to FIG. 4, in a bottom-emitter OLED display according to the present invention, the ITO is provided with a periodic grating pattern similar to that of the insulating layer 16 of the top emitter in the areas where light is emitted. The grating pattern is created in the ITO layer using well-known photolithography techniques. A thin metal electrode layer 15 is deposited on the corrugated ITO, the organic materials are conformably deposited on the metal layer, and the remainder of the depositions are as described earlier. The thin metal electrode 15 may be omitted, but surface plasmon coupling will not be supported in the ITO layer alone.

Because the emitted light 24 is polarized and has an angular dependence on frequency, a diffuser may be included in the display 10 to mitigate the effect of color aberrations. This diffuser may be applied to the exterior of the device, for example, or the diffuser may be incorporated into the cover (for a top emitter) or the substrate (for a bottom emitter).

In another embodiment of the present invention, the period of the structure of the insulating layer 16 and conformable layers deposited upon it may be constant across the device rather than different for each individual color 19R, G, and B. This simplifies the construction of the device with some loss in efficiency of the light output and angular dependence of frequency.

Details of the OLED materials, layers, and architecture are described in more detail below.

GENERAL DEVICE ARCHITECTURE

The present invention can be employed in most OLED device configurations. These include very simple structures comprising a single anode and cathode to more complex devices, such as passive matrix displays comprised of orthogonal arrays of anodes and cathodes to form pixels, and active-matrix displays where each pixel is controlled independently, for example, with thin-film transistors (TFTs).

Figure 5:
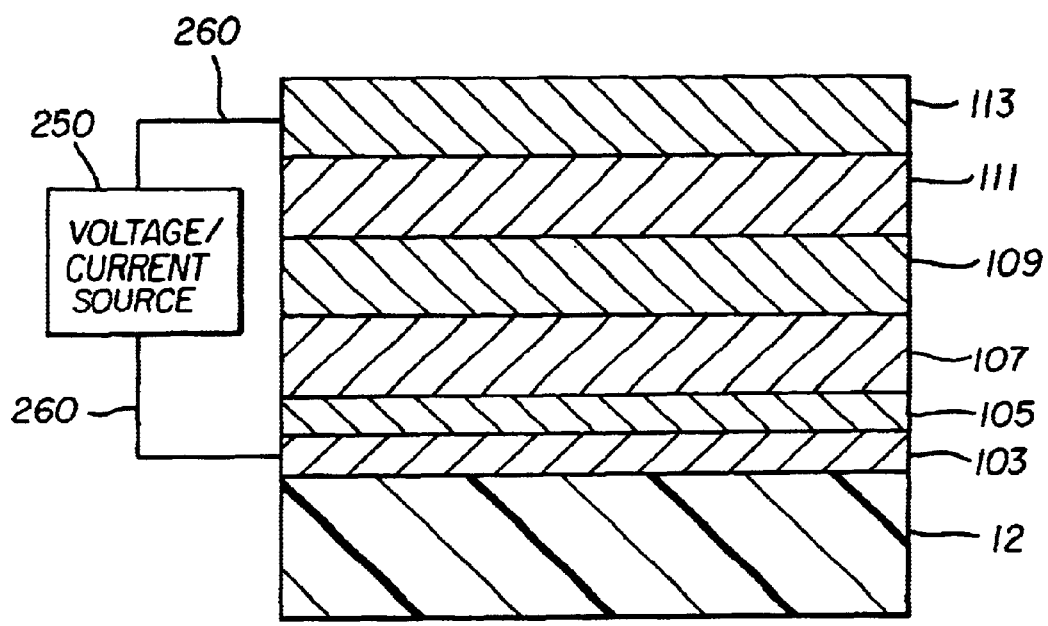
FIG. 5 is a schematic cross sectional diagram of a generic prior OLED structure.

There are numerous configurations of the organic layers wherein the present invention can be successfully practiced. A typical structure is shown 10 in FIG. 5 and is comprised of a substrate 12, an anode 103, a hole-injecting layer 105, a hole-transporting layer 107, a light-emitting layer 109, an electron-transporting layer 111, and a cathode 113. These layers are described in detail below. Note that the substrate may alternatively be located adjacent to the cathode, or the substrate may actually constitute the anode or cathode. The organic layers between the anode and cathode are conveniently referred to as the organic EL element. The total combined thickness of the organic layers is preferably less than 500 nm.

The anode and cathode of the OLED are connected to a voltage/current source 250 through electrical conductors 260. The OLED is operated by applying a potential between the anode and cathode such that the anode is at a more positive potential than the cathode. Holes are injected into the organic EL element from the anode and electrons are injected into the organic EL element at the anode. Enhanced device stability can sometimes be achieved when the OLED is operated in an AC mode where, for some time period in the cycle, the potential bias is reversed and no current flows. An example of an AC driven OLED is described in U.S. Pat. No. 5,552,678.

Substrate

The OLED device of this invention is typically provided over a supporting substrate where either the cathode or anode can be in contact with the substrate. The electrode in contact with the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Of course it is necessary to provide in these device configurations a light-transparent top electrode.

Anode

When EL emission is viewed through anode 103, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode electrode, the transmissive characteristics of anode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize shorts or enhance reflectivity.

Hole-Injecting Layer (HIL)

While not always necessary, it is often useful to provide a hole-injecting layer 105 between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. No. 6,208,075, and some aromatic amines, for example, m-MTDATA (4,4',4"-tris[(3-methylphenyl)phenylamino]triphenylamine). Alternative hole-injecting materials reportedly useful in organic EL devices are described in EP 0 891 121 A1 and EP 1 029 909 A1.

Hole-Transporting Layer (HTL)

The hole-transporting layer 107 contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen containing group are disclosed by Brantley et al. U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The hole-transporting layer can be formed of a single or a mixture of aromatic tertiary amine compounds. Illustrative of useful aromatic tertiary amines are the following:

1,1-Bis(4-di-p-tolylaminophenyl)cyclohexane
    1,1-Bis(4-di-p-tolylaminophenyl)-4-phenylcyclohexane
    4,4'-Bis(diphenylamino)quadriphenyl
    Bis(4-dimethylamnino-2-methylphenyl)-phenylmethane
    N,N,N-Tri(p-tolyl)amine
    4-(di-p-tolylamino)-4'-[4-(di-p-tolylamino)-styryl]stilbene
    N,N,N',N'-Tetra-p-tolyl-4-4'-diaminobiphenyl
    N,N,N',N'-Tetraphenyl-4,4'-diaminobiphenyl
    N,N,N',N'-tetra-1-naphthyl-4,4'-diaminobiphenyl
    N,N,N',N'-tetra-2-naphthyl-4,4'-diaminobiphenyl
    N-Phenylcarbazole
    4,4'-Bis[N-(1-naphthyl)-N-phenylamino]biphenyl
    4,4'-Bis[N-(1-naphthyl)-N-(2-naphthyl)amino]biphenyl
    4,4"-Bis[N-(1-naphthyl)-N-phenylamino]p-terphenyl
    4,4'-Bis[N-(2-naphthyl)-N-phenylamino]biphenyl
    4,4'-Bis[N-(3-acenaphthenyl)-N-phenylamino]biphenyl
    1,5-Bis[N-(1-naphthyl)-N-phenylamino]naphthalene
    4,4'-Bis[N-(9-anthryl)-N-phenylamino]biphenyl
    4,4"-Bis[N-(1-anthryl)-N-phenylamino]-p-terphenyl
    4,4'-Bis[N-(2-phenanthryl)-N-phenylamino]biphenyl
    4,4'-Bis[N-(8-fluoranthenyl)-N-phenylamino]biphenyl
    4,4'-Bis[N-(2-pyrenyl)-N-phenylamino]biphenyl
    4,4'-Bis[N-(2-naphthacenyl)-N-phenylamino]biphenyl
    4,4'-Bis[N-(2-perylenyl)-N-phenylamino]biphenyl
    4,4'-Bis[N-(1-coronenyl)-N-phenylamino]biphenyl
    2,6-Bis(di-p-tolylamino)naphthalene
    2,6-Bis[di-(1-naphthyl)amino]naphthalene
    2,6-Bis[N-(1-naphthyl)-N-(2-naphthyl)amino]naphthalene
    N,N,N',N'-Tetra(2-naphthyl)-4,4"-diamino-p-terphenyl
    4,4'-Bis{N-phenyl-N-[4-(1-naphthyl)-phenyl]amino}biphenyl
    4,4'-Bis[N-phenyl-N-2-pyrenyl)amino]biphenyl
    2,6-Bis[N,N-di(2-naphthyl)amine]fluorene
    1,5-Bis[N-(1-naphthyl)-N-phenylamino]naphthalene
    4,4',4"-tris[(3-methylphenyl)phenylamino]triphenylamine Another class of useful hole-transporting materials includes polycyclic aromatic compounds as described in EP 1 009 041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. 4,769,292 and 5,935,721, the light-emitting layer (LEL) 109 of the organic EL element includes a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material. For phosphorescent emitters it is also important that the host triplet energy level of the host be high enough to enable energy transfer from host to dopant.

Host and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine[alias, tris(8-quinolinolato) aluminum(III)]
    CO-2: Magnesium bisoxine[alias, bis(8-quinolinolato) magnesium(II)]
    CO-3: Bis[benzo{f}-8-quinolinolato]zinc (II)
    CO-4: Bis(2-methyl-8-quinolinolato)aluminum(III)-$\mu$-oxo-bis(2-methyl-8-quinolinolato) aluminum(III)
    CO-5: Indium trisoxine[alias, tris(8-quinolinolato) indium]
    CO-6: Aluminum tris(5-methyloxine)[alias, tris(5-methyl-8-quinolinolato) aluminum(III)]
    CO-7: Lithium oxine[alias, (8-quinolinolato)lithium(I)]
    CO-8: Gallium oxine[alias, tris(8-quinolinolato)gallium (III)]
    CO-9: Zirconium oxine[alias, tetra(8-quinolinolato) zirconium(IV)]

Other classes of useful host materials include, but are not limited to: derivatives of anthracene, such as 9,10-di-(2-naphthyl)anthracene and derivatives thereof as described in U.S. Pat. No. 5,935,721, distyrylarylene derivatives as described in U.S. Pat. No. 5,121,029, and benzazole derivatives, for example, 2,2',2"-(1,3,5-phenylene)tris[1-phenyl-1H-benzimidazole]. Carbazole derivatives are particularly useful hosts for phosphorescent emitters.

Useful flourescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl)methane compounds, and carbostyryl compounds.

Electron-Transporting Layer (ETL)

Preferred thin-film-forming materials for use in forming the electron-transporting layer 111 of the organic EL elements of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin-films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

Cathode

When light emission is viewed solely through the anode, the cathode 113 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injection layer (EIL) in contact with the organic layer (e.g., ETL) which is capped with a thicker layer of a conductive metal. Here, the EEL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861, 5,059,862, and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 4,885,211, U.S. Pat. No. 5,247,190, JP 3,234,963, U.S. Pat. No. 5,703,436, U.S. Pat. No. 5,608,287, U.S. Pat. No. 5,837,391, U.S. Pat. No. 5,677,572, U.S. Pat. No. 5,776,622, U.S. Pat. No. 5,776,623, U.S. Pat. No. 5,714,838, U.S. Pat. No. 5,969,474, U.S. Pat. No. 5,739,545, U.S. Pat. No. 5,981,306, U.S. Pat. No. 6,137,223, U.S. Pat. No. 6,140,763, U.S. Pat. No. 6,172,459, EP 1 076 368, U.S. Pat. No. 6,278,236, and U.S. Pat. No. 6,284,393. Cathode materials are typically deposited by evaporation, sputtering, or chemical vapor deposition. When needed, patterning can be achieved through many well known methods including, but not limited to, through-mask deposition, integral shadow masking, for example, as described in U.S. Pat. No. 5,276,380 and EP 0 732 868, laser ablation, and selective chemical vapor deposition.

Other Common Organic Layers and Device Architecture

In some instances, layers 109 and 111 can optionally be collapsed into a single layer that serves the function of supporting both light emission and electron transportation. It also known in the art that emitting dopants may be added to the hole-transporting layer, which may serve as a host. Multiple dopants may be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, U.S. Pat. No. 20,020,025,419, EP 1 182 244, U.S. Pat. No. 5,683,823, U.S. Pat. No. 5,503,910, U.S. Pat. No. 5,405,709, and U.S. Pat. No. 5,283,182.

Additional layers such as electron or hole-blocking layers as taught in the art may be employed in devices of this invention. Hole-blocking layers are commonly used to improve efficiency of phosphorescent emitter devices, for example, as in U.S. Pat. No. 20,020,015,859.

This invention may be used in so-called stacked device architecture, for example, as taught in U.S. Pat. No. 5,703,436 and U.S. Pat. No. 6,337,492.

Deposition of Organic Layers

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551, 5,851,709 and 6,066,357) and inkjet method (U.S. Pat. No. 6,066,357).

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

The entire contents of the patents and other publications referred to in this specification are incorporated herein by reference.

The invention has been described in detail with particular reference to certain preferred embodiments thereof, but it will be understood that variations and modifications can be effected within the spirit and scope of the invention.

PARTS LIST

10 OLED display device
12 substrate
13 ITO layer
14 TFT layer
15 metal electrode layer
16 insulating layer
17 second insulating layer
18 first electrodes
19 OLED layer
19R red-emitting organic materials layer
19G green-emitting organic materials layer
19B blue-emitting organic materials layer
24 emitted light
24R red light
24G green light
24B blue light
30 second electrode
32 second electrode protection layer
36 encapsulating cover
103 anode
105 hole injection layer
107 hole transport layer
109 light emitting layer
111 electron transport layer
113 cathode
250 voltage/current source
260 electrical conductors

What is claimed is:

1. A top-emitting active matrix organic light emitting diode (OLED) display, comprising:
    a) a substrate;
    b) a thin-film transistor (TFT) layer formed on the substrate;
    c) an insulating layer formed over the TFT layer, the insulating layer defining a periodic grating structure;
    d) a first electrode layer formed over the insulating layer and conforming to the grating structure;
    e) an OLED material layer formed over the first electrode layer and conforming to the grating structure; and
    f) a second electrode layer formed over the OLED material layer and conforming to the grating structure, wherein the first and/or second electrode layers are metallic layers, whereby the periodic grating structure induces surface plasmon cross coupling in the metallic electrode layer(s).

2. The display claimed in claim 1, wherein the OLED material layer includes portions for emitting different colors of light and the period of the grating structure is different for the different colors.

3. The display claimed in claim 1, further comprising an encapsulating cover that is light diffusing.

4. The display claimed in claim 1, wherein the insulating layer is a light absorbing layer.

5. The display claimed in claim 1, wherein the metallic layers are opaque.

6. The display claimed in claim 1, wherein the grating structure is a two-dimensional grating.

7. A bottom-emitting active matrix organic light emitting diode (OLED) display, comprising:
    a) a substrate;
    b) a first electrode layer formed on the substrate, the first electrode layer having first portions defining a periodic grating structure and second portions free of such a grating structure;
    c) a thin-film transistor (TFT) layer formed on the second portions of the first electrode layer;
    d) an OLED material layer formed over the first portions of the first electrode layer and conforming to the grating structure; and
    e) a second electrode layer formed over the OLED material layer and conforming to the grating structure, wherein the first and/or second electrode layers are metallic layers, whereby the periodic grating structure induces surface plasmon cross coupling in the metallic layer(s).

8. The display claimed in claim 7, wherein the first electrode layer is non-metallic and further comprising a metallic layer formed on the first portions of the first electrode layer and conforming to the grating structure.

9. The display claimed in claim 7, wherein the OLED material layer includes portions for emitting different colors of light and the period of the grating structure is different for the different colors.

10. The display claimed in claim 7, wherein the substrate is light diffusing.

11. The display claimed in claim 7, wherein the metallic layers are opaque.

12. The display claimed in claim 7, wherein the grating structure is a two-dimensional grating.

13. The display claimed in claim 7, wherein the first electrode layer is indium tin oxide.

* * * * *